United States Patent [19]

Evans

[11] 3,906,351

[45] Sept. 16, 1975

[54] DIGITAL TUNING OF VOLTAGE CONTROL TELEVISION TUNERS

[75] Inventor: Wayne Wheeler Evans, Carmel, Ind.

[73] Assignee: RCA Corporation, New York, N.Y.

[22] Filed: Jan. 18, 1974

[21] Appl. No.: 434,383

[52] U.S. Cl. .................... 325/459; 325/464; 334/15
[51] Int. Cl.² ............................................ H04B 1/26
[58] Field of Search ........... 325/462, 464, 465, 418, 325/420, 459; 334/15, 16

[56] References Cited

UNITED STATES PATENTS

| | | | |
|---|---|---|---|
| 3,602,822 | 8/1971 | Evans et al. | 325/464 |
| 3,705,356 | 12/1972 | Russell | 325/462 |
| 3,778,736 | 12/1973 | Sakamoto | 325/465 |

*Primary Examiner*—George H. Libman
*Attorney, Agent, or Firm*—Eugene M. Whitacre; Stephan Siegel

[57] ABSTRACT

A television channel address system incorporates ten touch buttons for digitally addressing a tuner to select a desired television channel. The numerical channel command is converted into an analog tuning voltage for tuning an associated voltage controlled tuner. Automatic fine tuning voltage developed in the television receiver modifies the developed analog tuning voltage for precisely placing the tuner on the desired channel frequency.

11 Claims, 4 Drawing Figures

CONTROLLABLE REFERENCE SUPPLY

DIGITAL TUNING OF VOLTAGE CONTROL TELEVISION TUNERS

This invention relates to tuning systems for television receivers and, more particularly, to a system for digitally addressing a tuner to select a desired television channel.

In many of the more populated areas of the world, television receivers are designed to receive signals on a significant number of televsion channels. In a television receiver, for example, of the type used in the United States, there are 82 selectable television channels. It is desirable to be able to select any one of these channels with equal ease, that is, to have a tuning system in which each channel may be addressed by the same process. Currently, channel selection systems that are used or have been proposed for television receivers utilize tuning systems that require either sequential tuning — that is, tuning through channels interposed between the desired channel and a channel that was previously selected or systems which provide digital channel selection of only a portion (e.g., in the U.S., the UHF channels) of the available 82 channels. The former system has the disadvantage of requiring a much greater access time in tuning from, for example, a low numbered channel to a high numbered channel as compared to tuning from one channel to an adjacent channel. The latter system has the disadvantage of being able to tune to only a portion of the available channels.

In accordance with the present invention, a television receiver incorporating one or more voltage controlled tuners and providing an automatic fine tuning voltage may be tuned to any available television channel by selectively applying an analog tuning voltage corresponding to a frequency associated with the desired television channel to the television tuner. The analog tuning voltage is developed by providing selecting means responsive to numerical commands to provide electrical signals representative of a desired television channel. Storage register means are coupled to the selecting means and the signals provided by the selecting means are stored therein. A variable reference voltage is developed by providing a relatively fixed reference voltage source coupled to and responsive to the automatic fine tuning voltage developing apparatus in the television receiver. A converting means is coupled to the reference voltage source and converts the variable reference voltage to an analog tuning voltage in response to the signals stored in the register. The output of the converting means is coupled to the voltage controlled tuner for providing a tuning voltage to tune the tuner to the desired channel.

A better understanding of the invention may be derived from the following detailed description in connection with the accompanying drawing in which.

Figure 1:
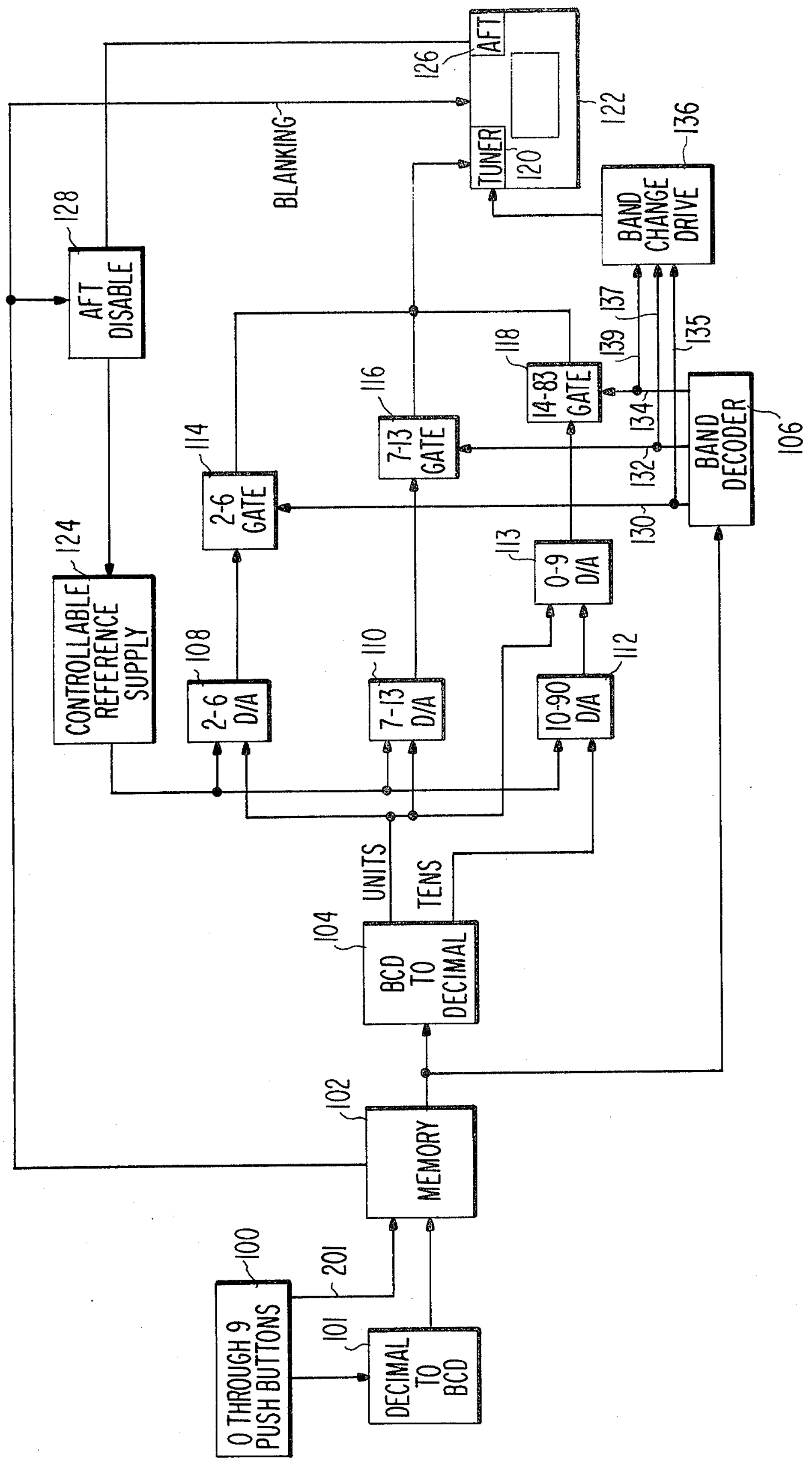
FIG. 1 is a block diagram of a channel selection system incorporating the invention.

With reference to FIG. 1, an assembly including ten touch or push button switches 100 (labelled 0 through 9) has buttons one through nine coupled to a decimal to binary-coded decimal (BCD) converter 101. The button assembly 100 may be of a type commonly employed in small electronic calculators. The output of converter 101 is coupled to a memory 102 wherein numerical representative electrical signals are stored. A separate line 201 from assembly 100 couples a zero digit output directly to memory 102.

Memory 102 is coupled to a BCD to decimal decoder 104 and also to a band decoder 106. A numerical display (not shown) may also be coupled to memory 102 for providing a display of the selected television channel number. Three digital to analog (D/A) converters 108, 110 and 113 are coupled to a units outputs of decoder 104. A fourth D/A converter 112 is coupled to a tens output of decoder 104. Transfer gates 114, 116 and 118 are coupled to the respective outputs of digital to analog converters 108, 110 and 113. The output terminals of transfer gates 114, 116 and 118 are coupled in common to a voltage controlled tuner 120 associated with a television receiver 122. Tuner 120 may include separate UHF and VHF tuner portions such as the RCA model KRK 194 UHF tuner and the RCA KRK 155 VHF tuner which are shown in RCA Television Service Data, File 1973, No. C-10, published by RCA Corporation, Indianapolis, Indiana. Each of the abovenamed tuners utilizes varactor tuning elements to control tuner frequency but it should be recognized that other types of voltage tuners may be used as well.

Band decoder 106 has three output lines 130, 132 and 134 respectively coupled to control terminals of transfer gates 114, 116 and 118 and to input terminals on band charge drive circuit 136. Drive circuit 136 is coupled to tuner 120 and provides voltage levels to switch frequency bands in tuner 120 as is set forth in the above-referenced Service Data.

A controllable source of reference voltage 124 is coupled to D/A converters 108, 110 and 112 and provides a voltage level from which analog tuning signals are derived. An automatic fine tuning (AFT) circuit 126, for example, of the type shown in the above-referenced Service Data, is located within television receiver 122 and is coupled to the controllable reference source 124 through an AFT disable circuit 128. AFT circuit 126 provides a variable correction voltage for modifying the output voltage supplied by the source of reference voltage 124.

A blanking output from memory 102 is coupled to receiver 122 and to AFT disable circuit 128 for inhibiting operation of such circuits as AFT, sound and video whenever the channel changing or selection process is in progress.

In the operation of the system shown in FIG. 1, one of the buttons of assembly 100, representative of the tens digit of the desired television channel, is depressed by the viewer. Although assembly 100 is referred to as having push button switches, other type devices which provide contact closure or electrical circuit closure may be used. If the desired channel is any one of channels 2 through 9, the zero (0) button is depressed first. If the desired channel is any one of those in the range of channels 10 through 83, a corresponding tens digit of one through eight is depressed. Depression of one of the buttons of assembly 100 produces a signal either on one of nine lines (shown diagrammatically as a single line) at the output of assembly 100, which signal is coupled to decimal to BCD converter 101, or, if the digit is zero, on the tenth line 201 which is coupled directly to memory 102. Converter 101 converts the signal derived from button assembly 100 into a binary coded decimal (BCD) number and transfers it via four lines (shown as a single line) to a tens register in memory 102 (details of which will be explained below referring to FIG. 2). Upon entry of a first digit of the two digit channel command into memory 102, a blanking signal is supplied from memory 102. This blanking signal operates to blank the displayed image, mute the sound of television receiver 122 and disable the output of AFT signals from AFT circuit 126. AFT signals are disabled during channel change to allow channel change without any effect by the AFT signals.

To complete the channel selection command, a units digit 0 thorugh 9 is selected. The selected button of assembly 100 is depressed, providing a signal on the appropriate one of the ten associated output lines. As before, if the number is any of the numbers one through nine, converter 101 converts the signal from button assembly 100 to a BCD number and memory 102 stores this number in an associated units register. A zero is coupled directly to memory 102. Upon receiving this second (units) digit command, memory 102 ceases providing the blanking signal to television receiver 122, restoring sound and video and inactivating AFT disabling circuitry 128.

Eight output lines (shown as a single line) representing the tens and units digits of the channel information stored in binary coded decimal form in memory 102 are coupled to BCD to decimal decoder 104 and to band decoder 106. Band decoder 106 decodes the BCD numbers supplied from memory 102 and provides output signals on one of three output lines to indicate in which of three bands the selected channel lies. For example, channels 2 through 6 are considered to be in band 1, channels 7 through 13 are in band 2 and channels 14 through 83 are in band 3. Additional output lines and decoding circuitry may be added to decoder 106 for providing output signals corresponding to other bands, for example, channels 84 through 89 and 90 through 99, which may then correspond to channels used for other functions such as cable television. Output lines 130, 132 and 134 from band decoder 106 are respectively coupled to the control terminals of transfer gate 114, 116 and 118 and provide signals to selectively operate one of these gates in response to a channel command. Gates 114, 116 and 118 operate to pass a selected one of the simultaneously derived analog tuning voltages developed respectively by D/A converters 108, 110 and 113 to tuner 120.

BCD to decimal decoder 104 decodes the information supplied on eight BCD lines provided by memory 102 into information supplied on 20 lines (shown diagrammatically as two lines labelled "units" and "tens"), the first 10 of which correspond to a tens digit and the second 10 of which correspond to a units digit. The unit lines of decoder 104 are coupled to D/A converters 108, 110 and 113 and provide a numerical representative signal which is to be converted into an analog voltage. Similarly, the tens lines from decoder 104 are coupled to D/A converter 112, providing the tens digit signal to be converted into an appropriate analog voltage. It is not necessary to provide a tens line to converter 110 since the seven channel numbers in the range of 7 to 13 can be uniquely selected with an appropriate units digit (e.g., eight equals channel eight, two equals channel twelve) and the necessary band selection signal.

A detailed explanation of the operation of the associated D/A converters is given later in this specification with reference to FIG. 4. The analog voltages derived from D/A converters 108 and 110 correspond, respectively, to the tuning voltage ranges required to tune tuner 120 to channels 2 through 6 and 7 through 13. In tuning tuner 120 to channels 14 through 83, however, two D/A converters are utilized in order to derive the requisite tuning voltages. D/A converter 112 is responsive to the tens digit portion of the channel command and provides, for each tens digit command, two voltage outputs which correspond to the end channels of a tuning range of eleven channels, i.e., 10–20, 20–30, etc. The voltage range provided by converter 112 is further subdivided by converter 113 into voltages corresponding to individual ones of the channels within the selected eleven channel tuning range. That is, converter 113 is responsive to the units digit portion of the channel command and provides a single tuning voltage at its output corresponding to the selected channel in the particular tuning range (e.g., 14 through 83).

In order to provide the requisite analog tuning voltages, D/A converters 108, 110 and 112 receive a reference voltage from reference source 124. Reference source 124 contains a relatively constant voltage supply. In addition, reference source 124 is arranged such that its output voltage is modulated by the automatic fine tuning voltage (AFT) developed in television receiver 122. AFT voltage developed in television receiver 122 is responsive to the deviation in frequency beween the received television signal picture carrier wave and the frequency of the carrier wave which the television receiver is tuned to receive. Typically, this frequency deviation is sensed in terms of a difference between the frequency of the converted intermediate frequency picture carrier and a fixed tuned circuit. The resulting AFT correction voltage is coupled to and operates to change the voltage coupled from reference supply 124 to the D/A converters 108, 110 and 112. The voltage provided by reference supply 124 varies in response to the AFT voltage to change the tuning voltage supplied to tuner 120 and thereby minimize the frequency error between the desired received signal and the operating condition of the tuner. A detailed explanation of a controllable reference source is given below (following the description of FIG. 2) with reference to FIG. 3.

Figure 2:
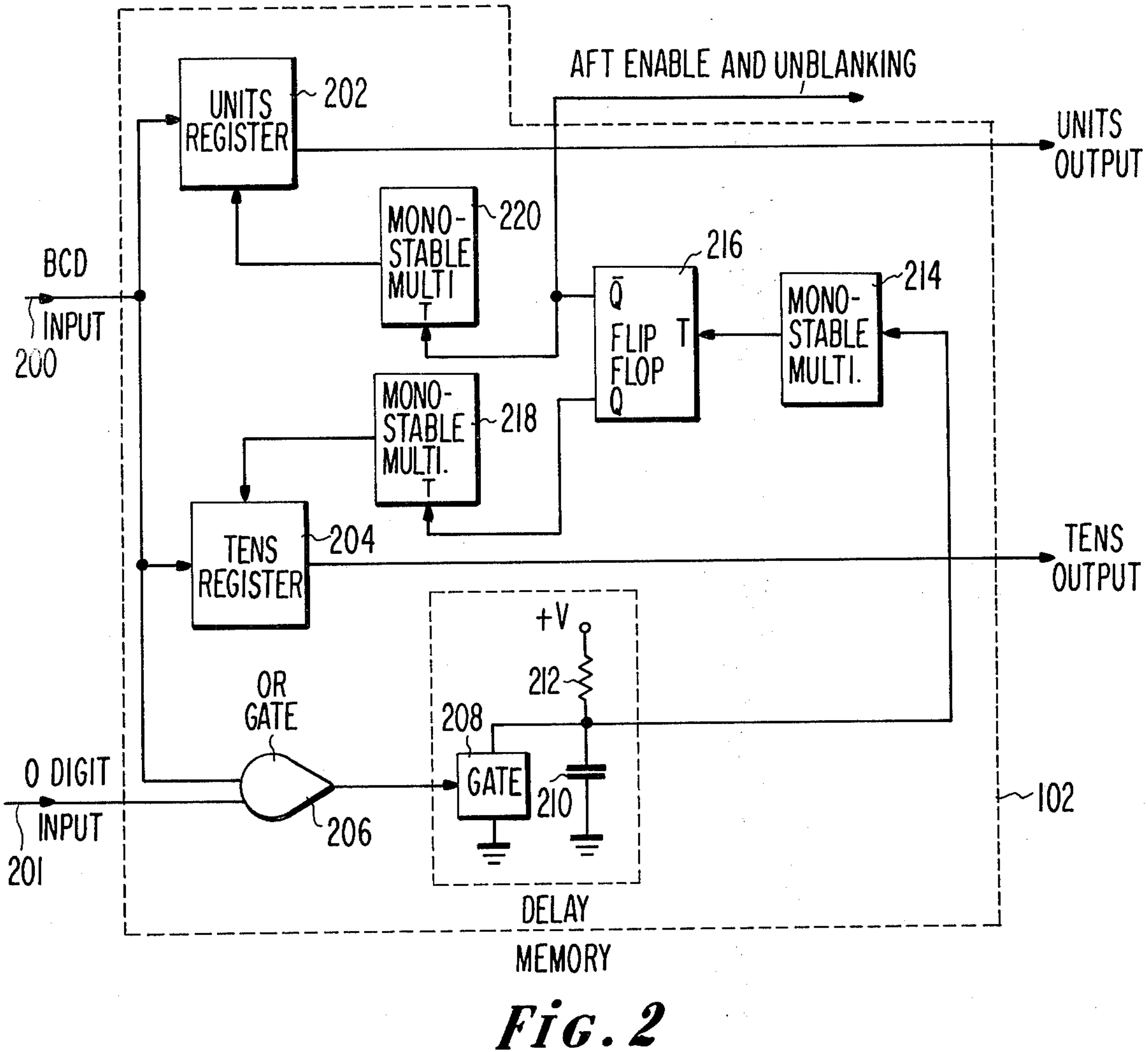
FIG. 2 is a detailed block diagram of memory apparatus illustrated in FIG. 1.

FIG. 2 illustrates a more detailed representation of memory 102. A transmission path of four lines, shown as a single input line 200, receives the BCD signals from the combination of converter 101 and push button assembly 100 (see FIG. 1) and applies these signals to units register 202, tens register 204 and OR gate 206. A second input line 201 to OR gate 206 is coupled to the zero digit output from push button assembly 100. OR gate 206 is coupled to and provides control signals to a gate 208. Gate 208 is coupled across a capacitor 210 and operates to maintain capacitor 210 discharged in the absence of enabling signals. Capacitor 210 also is coupled to a source of supply voltage (+V) through a resistor 212. An input terminal of a monostable multivibrator 214 is coupled to the junction of resistor 212 and capacitor 210. Output signals provided by monostable multivibrator 214 are coupled to a trigger terminal (T) of a flip-flop (bistable circuit) 216 and provide signals for changing the output state of flip-flop 216. A second monostable multivibrator 218 is coupled to a "Q" terminal of flip-flop 216 and receives enabling signals from flip-flop 216. Similarly, a third monostable multivibrator 220 receives enabling signals from a "$\overline{Q}$" terminal of flip-flop 216. An output terminal of monostable multivibrator 218 is coupled to a storage-enabling input of tens register 204 for allowing storage of the BCD signal on line 200. Units register 202 has a storage-enabling input coupled to monostable multivibrator 220 for enabling storage of the signals applied to line 200.

Upon application of a first decimal digit of a channel change command from push button assembly 100, a BCD signal indicative of this portion (the tens portion) of the command is applied to input line 200 or, in the case of a zero digit, to input line 201. OR gate 206 provides an output signal responsive to this first command thereby opening gate 208. When gate 208 is opened, capacitor 210 begins to charge towards the +V supply voltage. Upon capacitor 210 reaching a predetermined voltage, monostable multivibrator 214 triggers, creating a pulse of about 50 milliseconds duration at its output which, in turn triggers flip-flop 216. Flip-flop 216 is arranged such that upon turn-on of television receiver 122, the Q output of flip-flop 216 is caused to assume a low state and the $\overline{Q}$ output to assume a high state. Subsequent channel change commands, as will be shown below, provide a sequence of two triggering signals to flip-flop 216 thereby causing the Q output to sequence through a high state and a low state. The Q output of flip-flop 216 therefore remains in a low state after each complete (two digit) channel change command. The triggering pulse provided by multivibrator 214 and responsive to a first decimal digit (i.e., tens command) causes the Q output of flip-flop 216 to change from a low state into a high state and in turn trigger monostable multivibrator 218. The output pulse from monostable multivibrator 218 is of a relatively narrow width of about 300 microseconds and is of sufficient duration to allow the BCD signals on input line 200 representative of the first digit, to be stored in register 204. Release of the depressed push button of assembly 100, eliminates signals to OR gate 206 consequently causing gate 208 to close and rapidly discharge capacitor 210. The succession of delays and momentary pulses created thus far have been to eliminate errors due to contact bounce, erroneous noise pulses and errors resulting from rapid depression and release of push buttons 100.

Upon depression of a second digit of the push button assembly 100, a signal corresponding to the units portion of the desired channel number is applied to input 200. OR gate 206 once again applies a signal to gate 208, opening this gate and allowing capacitor 210 to charge towards the +V supply voltage. When the voltage level of capacitor 210 reaches a predetermined level, monostable multivibrator 214 is triggered, producing an output pulse. The output pulse from multivibrator 214 toggles flip-flop 216 such that the $\overline{Q}$ output now becomes high. A high output from $\overline{Q}$ triggers monostable multivibrator 220. The output pulse from multivibrator 220 is similar to that from multivibrator 218 and operates to allow storage of the BCD information on input line 200 in units register 202. The $\overline{Q}$ output on flip-flop 216 remains high after completion of the channel selection command and is used to render AFT disable circuit 128 ineffective, and unblank the video and sound in television receiver 122 as mentioned above in connection with FIG. 1.

Figure 3:
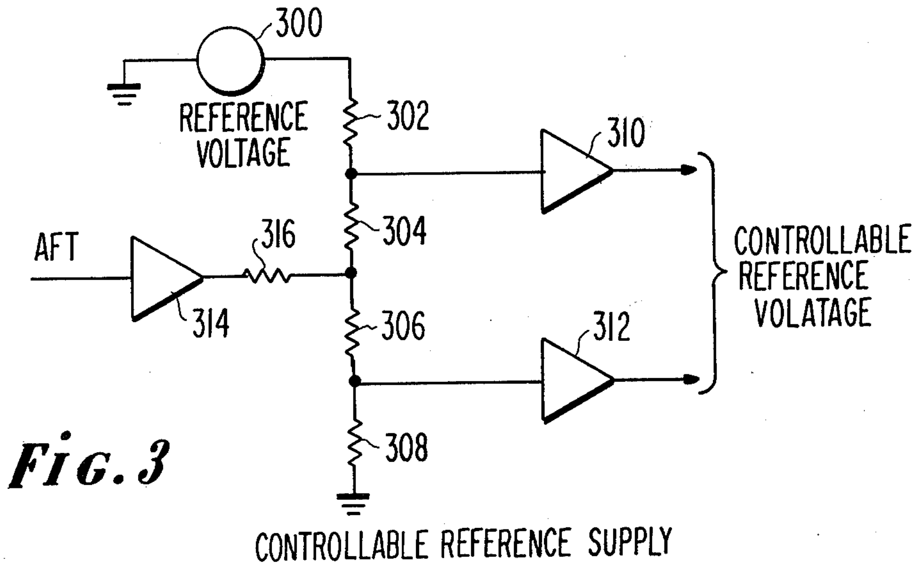
FIG. 3 is a detailed block diagram of a controllable reference voltage source illustrated in FIG. 1.

FIG. 3 illustrates a detailed representation of a controllable reference supply 124. A source of relatively fixed, direct reference voltage 300, which may be derived in numerous ways known in the art, is coupled across the series combination of resistors 302, 304, 306 and 308. A buffer amplifier 310, having a relatively high impedance input terminal, is coupled to the junction of resistors 302 and 304 and provides, at a relatively low output impedance level, an output voltage proportional to the voltage provided at its input. A second buffer amplifier 312, having a relatively high impedance input terminal, is coupled to the junction of resistors 306 and 308 and provides, at a relatively low output impedance level, an output voltage proportional to that provided to its input. A third buffer amplifier 314 or signal translating stage has an output coupled to the junction of resistors 304 and 306 through a resistor 316 and provides a voltage to the resistor combination 302, 304 and 306, 308 that is proportional to an AFT voltage applied to its input.

In the operation of the circuit of FIG. 3, reference voltage source 300 provides a current through the series resistor network 302, 304, 306 and 308. The resistor network divides this reference voltage with respect to ground into high and low output voltages as formed at the respective junctions of resistors 302, 304 and 306, 308. The high output voltage at the junction of resistors 302 and 304 is coupled through a buffer amplifier 310 which decouples the load at the output of this amplifier from the relatively high impedance of resistors 302, 304, 306 and 308. Similarly, the low output voltage provided at the junction of resistors 306 and 308 is coupled to a buffer amplifier 312. Buffer amplifier 314 receives AFT voltage from television receiver 122 and provides, at a low source impedance, a voltage proportional to the AFT voltage. The AFT-representative voltage provided at the output of buffer amplifier 314 modulates the voltages provided to buffer amplifier 310 and buffer amplifier 312. Resistors 302, 304, 306, 308 and 316 are selected so that the relative voltage changes produced at the input bterminals of amplifiers 310 and 312, in response to supplied AFT voltages are in a proportion of about 3 to 1. That is, for a one unit change of the AFT signal, the input to buffer amplifier 310 will change about three times more than the input to buffer amplifier 312. This provides a desired amount of AFT control at both the high end of the tuning band (a higher tuning voltage) and at the low end of the tuning band (a lower tuning voltage).

Figure 4:
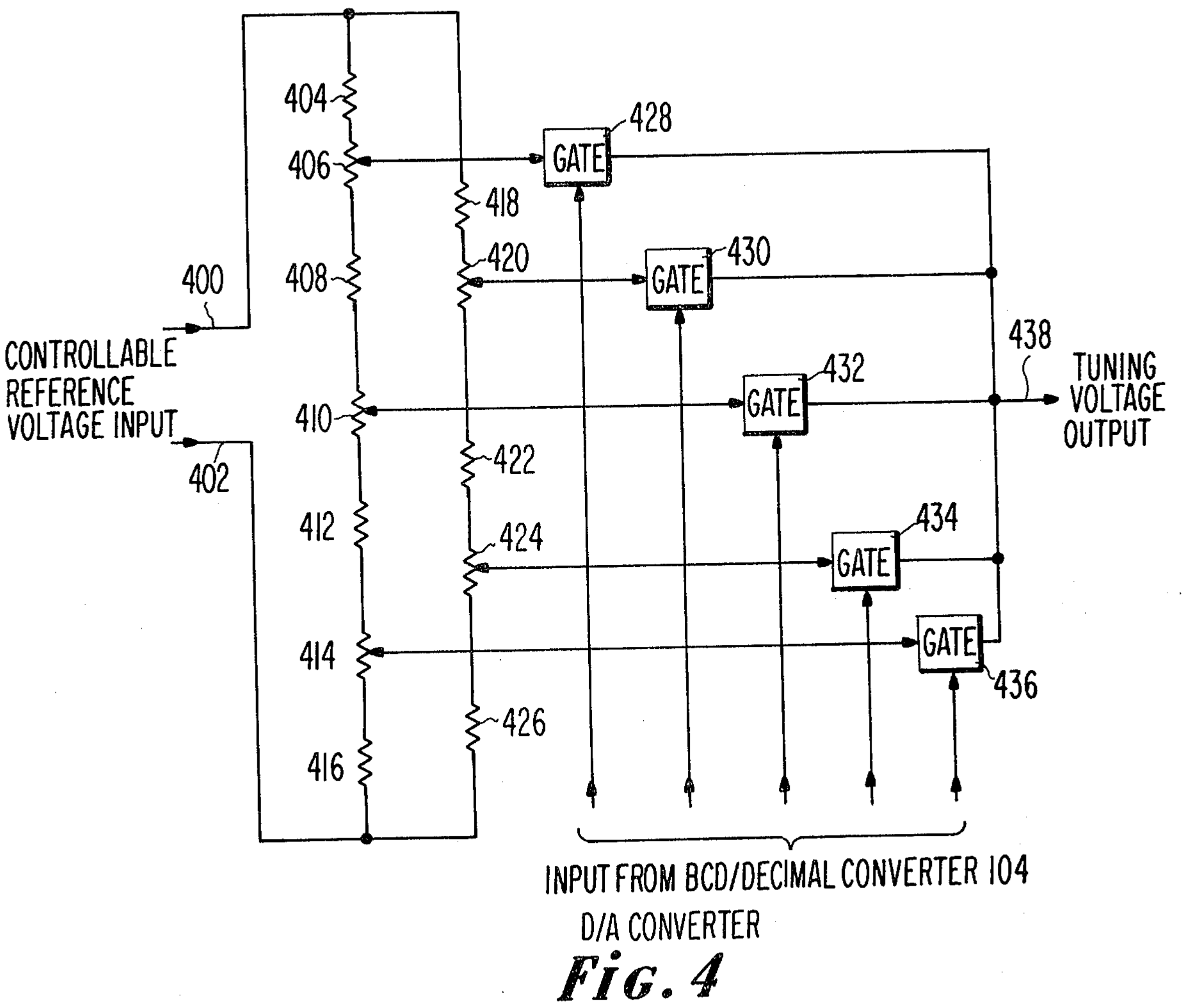
FIG. 4 is a detailed block diagram of a digital to analog converter illustrated in FIG. 1.

FIG. 4 illustrates a detailed representation of a D/A converter such as 2-6 D/A converter 108. Input terminals 400 and 402 are respectively coupled to the output terminals of buffer amplifiers 310 and 312 of the controllable reference supply (see FIG. 3). An alternating series of resistors and potentiometers 404, 406, 408, 410, 412, 414 and 416 is coupled across input terminals 400 and 402. A second alternating series of resistors and potentiometers 418, 420, 422, 424 and 426 is similarly coupled across input terminals 400 and 402. Gates 428, 430, 432, 434 and 436 are respectively coupled to the arms of potentiometers 406, 420, 410, 424 and 414. Output signals from each of the gates are coupled in common to an output terminal 438. Control signals to operate each of the five respective gates are provided by signals coupled from five of the ten units lines (shown in FIG. 1 as a single line) of BCD to decimal converter 104. In the operation of the above-described circuit, a reference voltage (as derived, for example, from the apparatus of FIG. 3) is coupled across inputs 400 and 402. This reference voltage supplies a current to the alternating series of resistors and potentiometers 404, 406, 408, 410, 412, 414 and 416 and also to the alternating series of resistors and potentiometers 418, 420, 422, 424 and 426. Voltages produced with respect to ground at the arms of potentiometers 406, 410, 414, 420 and 424 are adjusted such that the voltage provided to gate 428 from potentiometer 406 corresponds, in the given band, to tuning of the receiver to a particular channel of a relatively higher frequency, for example, channel 6, while that provided to gate 430 from potentiometer 420 is a lesser voltage and may correspond to tuning of the receiver to a lower frequency channel, for example, channel 5. Similarly, the voltages provided to gates 432, 434 and 436 by respective potentiometers 410, 424 and 414 are decreasing in value and correspond to lower frequency channels, for example, channels 4, 3 and 2, respectively. An input signal provided from converter 104 activates a particular input line corresponding to one of the gates, thereby allowing the selected gate to close and pass the voltage at its particular input to the tuning voltage output terminal 438. The above-described D/A converter has been illustrated with potentiometers for adjusting individual output voltages to correspond to particular television channels and to allow for variation in tuning voltage requirements of different tuners. Since the channel to which the television receiver is tuned is determined by the voltage applied to its tuner, it may be expected that component variation or aging effects will cause the tuning to change over a period of time. By adding the AFT voltage to the controllable reference source in the manner described, these undesirable effects may be avoided. Proper-tuning of the television receiver is thereby achieved with little regard for component aging effects.

D/A converters 110, 112 and 113 operate in a similar manner to the converter illustrated in FIG. 4. In the operation of converter 112, however, the output voltages provided thereby correspond to channels spaced a decade apart rather than individual channel numbers, i.e., channels 10, 20, 30, etc. By appropriately gating converter 112 so as to select and couple two adjacent output lines, for example, channels 20 and 30 of converter 112 to the input terminals of D/A converter 113, the voltages provided thereby may be further subdivided into voltages corresponding to ten individual channels. A more detailed description of a suitable combination of series coupled D/A converters may be found in a copending U.S. application, by the same inventor, entitled, Analog Voltage Generator For Television Tuners, Ser. No. 434,402 filed Jan. 18, 1974, and, assigned to RCA Corporation.

What is claimed is:

1. In combination with a television receiver having circuitry for developing an automatic fine tuning voltage, apparatus for numerically selecting a channel in an associated voltage controlled tuner comprising:

selecting means for providing binary coded signals responsive to numerical channel commands;

register means for storing said signals in binary coded form;

a reference voltage source;

means responsive to said automatic fine tuning voltage comprising a plurality of resistance elements coupled in series to said reference voltage source, said plurality having at least a first junction for providing a variable reference voltage, and a signal translating stage having an input terminal for receiving said automatic fine tuning voltage and an output terminal coupled to a second junction of said plurality of resistance elements, said translating stage providing a current in response to said automatic fine tuning voltage to said resistance elements which combines with current provided by said reference voltage source;

converting means responsive to said variable reference voltage and to said signals stored in said register means for converting said last-named signals to corresponding voltage levels; and means coupling said converting means to said tuner for providing tuning voltage to said tuner responsive to said numerical channel commands and to said automatic fine tuning voltage.

2. In combination with a television receiver having circuitry for developing an automatic fine tuning voltage, apparatus for numerically selecting a channel in an associated voltage controlled tuner comprising:

selecting means for providing binary coded signals responsive to numerical channel commands;

register means for storing said signals in binary coded form;

a reference voltage source;

means for providing a variable reference voltage comprising a plurality of resistance elements coupled in series to said reference voltage source, and a signal translating stage having an input terminal for receiving said automatic fine tuning voltage and an output terminal coupled to said plurality of resistance elements, said translating state providing a current in response to said automatic fine tuning voltage to said resistance elements which combines with current provided by said reference voltage source;

converting means responsive to said variable reference voltage and to said signals stored in said register means for converting said last-named signals to corresponding voltage levels, said converting means comprising a second plurality of resistance elements arranged in series and coupled across said variable reference voltage, and a plurality of gates each having input, output and control terminals, each of said input terminals being coupled to a respective one of said resistance elements of said second plurality, said control terminals being coupled to said register means for receiving signals therefrom to selectively close a particular one of said gates, and said output terminals being coupled in common for providing a single tuning voltage output according to the one of said gates closed by signals from said register means; and means coupling said converting means to said tuner for providing tuning voltage to said tuner repsonsive to said numerical channel commands and to said automatic fine tuning voltage.

3. Apparatus according to claim 2 wherein said register means comprises:

a bistable circuit element having an input terminal and complementary output terminals; and first and second registers each having input, output and storage-enabling terminals, said input terminals of said registers coupled in common to said selecting means for receiving binary coded signals representative of a selected channel number, said output terminals of said registers coupled to said converting means for providing channel representative signals thereto, and said storage enabling terminals respectively coupled to ones of said complementary output terminals of said bistable circuit element for receiving enabling signals to store said binary coded signals in said first and second registers.

4. Apparatus according to claim 3 wherein said selecting means comprises:

ten switches arranged for respectively providing signals corresponding to ten numerical digits, zero through nine; and converter means for converting signals provided by said switches into binary coded signals.

5. In combination with a television receiver having circuitry for developing an automatic fine tuning voltage, apparatus for numerically selecting a channel in an associated voltage controlled tuner comprising:

selecting means for providing binary coded signals responsive to numerical channel commands;

register means for storing said signals in binary coded form;

a reference voltage source;

means responsive to said automatic fine tuning voltage and coupled to said reference voltage source for providing a variable reference voltage;

converting means responsive to said variable reference voltage and to said signals stored in said register means for converting said last-named signals to corresponding voltage levels, said converting means comprising a plurality of resistance elements arranged in series and coupled across said variable reference voltage, and a plurality of gates each having input, output and control terminals, each of said input terminals being coupled to a respective one of said resistance elements, said control terminals being coupled to said register means for receiving signals therefrom to selectively close a particular one of said gates, and said output terminals being coupled in common for providing a single tuning voltage output according to the one of said gates closed by said register means; and means coupling said converting means to said tuner for providing tuning voltage to said tuner responsive to said numerical channel commands and to said automatic fine tuning voltage.

6. A channel address system for selecting a channel in a television receiver having a voltage controlled tuner and circuitry for developing an automatic fine tuning voltage comprising:

selecting means for providing electrical signals representative of a selected television channel;

band decoding means having an input and first and second output terminals, said input terminal coupled to said selecting means for receiving channel number-representative signals, said first output terminal providing signals in response to ones of selected channel numbers and said second output terminal providing signals in response to others of selected channel numbers;

at least to analog voltate generators;

gating means coupling said generators to said tuner and responsive to signals from said first and second output terminals for passing a tuning voltage from a selected one of said analog voltage generators to said tuner; and means coupling said automatic fine tuning voltage to said analog voltage generators for modulating said tuning voltage to provide precise tuning of said voltage controlled tuner.

7. Apparatus according to claim 6 wherein said means coupling said automatic fine tuning voltage comprises:

a reference voltage source;

a plurality of resistance elements coupled in series to said reference voltage source; and an amplifier having an input terminal for receiving said automatic fine tuning voltage and an output terminal coupled to said plurality of resistance elements, said amplifier providing a current in response to said automatic fine tuning voltage to said resistance elements which combines with current provided by said reference voltage source.

8. A channel address system for selecting a channel in a television receiver having a voltage controlled tuner and circuitry for developing an automatic fine tuning voltage comprising:

selecting means for providing electrical signals representative of a selected television channel;

decoding means having an input and first and second output terminals, said input terminal coupled to said selecting means for receiving channel number-representative signals, said first output terminal providing signals in response to ones of selected channel numbers and said second output terminal providing signals in response to others of selected channel numbers;

first and second analog voltage generators;

gating means coupling said generators to said tuner and responsive to signals from said first and second output terminals for passing a tuning voltage from a selected one of said analog voltage generators to said tuner; and means coupling said automatic fine tuning voltage to said analog voltage generators for modulating said tuning voltage to provide precise tuning of said voltage controlled tuner, said last-named means comprising a reference voltage source, a plurality of resistance elements coupled in series to said reference voltage source, and an amplifier having an input terminal for receiving said automatic fine tuning voltage and an output terminal coupled to said plurality of resistance elements, said amplifier providing a current in response to said automatic fine tuning voltage to said resistance elements which combines with current provided by said reference voltage source;

said first and second analog voltage generators comprising respective first and second pluralities of resistance elements arranged in series and coupled to said means for coupling automatic fine tuning voltage, and first and second pluralities of gates, each gate having input, output and control terminals, each of said input terminals on gates of said first plurality being coupled to a respective one of resistance elements in said first plurality, each of said input terminals on gates of said second plurality being coupled to a respective one of resistance elements in said second plurality, said control terminals of each gate being coupled to said selecting means for receiving signals to selectively close particular ones of said gates, and said output terminals being coupled to said gating means for providing tuning voltage signals thereto in accordance with the selected ones of said gates closed by signals from said selecting means.

9. Apparatus according to claim 8 including:

register means having at least first and second registers for respectively storing tens and units portions of a channel number provided by said selecting means interposed between said selecting means and said decoding means, said register means coupled between said selecting means and said analog voltage generators.

10. In combination with a television receiver having circuitry for developing an automatic fine tuning voltage or the like, apparatus for numerically selecting a channel in an associated voltage controlled tuner comprises:

ten switches for providing signals representative of a television channel number;

a storage register for storing signals provided by said switches;

a reference voltage source;

a first plurality of resistors coupled in series across said reference voltage source, said resistor series having at least first, second and third junctions, said first junction adapted for receiving said automatic fine tuning voltage and said second and third junctions adapted for providing voltages that are subdivisions of said reference voltage and vary in proportion to said automatic fine tuning voltage;

a second plurality of series coupled resistance elements coupled to said second and third junctions;

a plurality of gates each having input, output and control terminals, said input terminals respectively coupled to particular ones of resistance elements in said second plurality for providing a plurality of different voltages to said inputs, said output terminals coupled in common for providing a single output and said control terminals coupled to said storage register for receiving signals therefrom to selectively close particular ones of said gates; and coupling circuitry for connecting said single output to said voltage controlled tuner for providing a tuning voltage thereto.

11. A channel address system for selecting a channel in a television receiver having circuitry for developing an automatic fine tuning voltage and a voltage controlled tuner comprising:

ten switches for providing signals representative of a selected television channel number;

first and second digital to analog converters having control terminals coupled to said switches, respective output terminals for providing analog voltages in response to signals supplied from said switches, and combining means for receiving signals from said automatic fine tuning voltage to modulate the respective analog output voltages;

a band decoder responsive to signals provided by said switches for providing an output at a first output terminal in response to particular ones of selected television channels and an output at a second output terminal in response to particular others of selected television channels;

a first gate having an input terminal coupled to said first digital to analog converter, a control terminal coupled to said first output terminal of said band decoder and an output terminal coupled to said voltage controlled tuner; and a second gate having an input terminal coupled to said second digital to analog converter, a control terminal coupled to said second output terminal and an output terminal coupled in common with the output terminal of said first gate.

* * * * *